United States Patent [19]

Tijburg et al.

[11] 4,296,386

[45] Oct. 20, 1981

[54] SEMICONDUCTOR INJECTION LASER HAVING A MOVABLE LASER BEAM

[75] Inventors: Rudolf P. Tijburg; Peter J. de Waard; Teunis van Dongen, all of Eindhoven, Netherlands

[73] Assignee: U.S. Philips Corporation, New York, N.Y.

[21] Appl. No.: 6,606

[22] Filed: Jan. 26, 1979

[30] Foreign Application Priority Data

Feb. 2, 1978 [NL] Netherlands .......................... 7801181

[51] Int. Cl.[3] .............................................. H01S 3/19
[52] U.S. Cl. ............................ 331/94.5 H; 331/94.5 K
[58] Field of Search ...................... 331/94.5 H, 94.5 K; 357/18

[56] References Cited

U.S. PATENT DOCUMENTS

| 3,340,479 | 9/1967 | Ashkin | 331/94.5 H |
| 3,402,366 | 9/1968 | Williams et al. | 331/94.5 K |
| 3,701,044 | 10/1972 | Paoli et al. | 331/94.5 H |
| 3,702,975 | 11/1972 | Miller | 331/94.5 H |
| 4,161,701 | 7/1979 | Takeda et al. | 331/94.5 H |

OTHER PUBLICATIONS

D. Scifres et al., "Beam Scanning with Twin-Stripe Injection Laser", *Appl. Phys. Lett.*, vol. 33, No. 8, Oct. 15, 1978, pp. 702-704.

*Primary Examiner*—James W. Davie
*Attorney, Agent, or Firm*—Thomas A. Briody; Robert T. Mayer; Steven R. Biren

[57] ABSTRACT

A semiconductor injection laser includes two contact regions on two oppositely-located major surfaces of the semiconductor body. One of these contact regions is divided into two sub-contact regions which are separated by a gap, and the active zone of the laser can be moved in a direction transverse to that of the laser beam by controlling the current distribution between the two sub-contact regions in order to move the laser beam.

20 Claims, 13 Drawing Figures

SEMICONDUCTOR INJECTION LASER HAVING A MOVABLE LASER BEAM

BACKGROUND OF THE INVENTION

The invention relates to an injection laser in which the laser beam can be moved in a plane substantially parallel to the injecting p-n junction which is formed in a semiconductor body between two semiconductor regions of mutually opposite conductivity types and which adjoins an active zone in the semiconductor body, the semiconductor body comprising two oppositely located side surfaces between which an optical resonator is determined and two oppositely located major surfaces substantially parallel to the p-n junction which are provided with contact regions for passing a current across the p-n junction, a first of said contact regions being divided into two sub-contact regions with which the current distribution across the p-n junction can be controlled.

The said side surfaces may be at least partially-reflecting surfaces and may in that case themselves form the optical resonator. However, the optical resonator may also be determined by lattice structures in the semiconductor body as in the case, for example, in distributed feedback lasers. In this case the said side surfaces need not be reflective. In lasers of the conventional type the said side surfaces are substantially perpendicular to the plane of the p-n junction. However, other configurations are also possible in which, for example, said surfaces are bevelled by means of etching so as to obtain total reflection.

The active zone is to be understood to mean the region near the p-n junction in which during operation he amplification is so large that the spontaneous emission in said region changes into laser action when the current density through the p-n junction has reached a certain threshold value.

A contact region is to be understood to mean herein a conductive layer of, for example, a metal provided on the semiconductor body or a comparatively low-ohmic semiconductor region which is formed in the semiconductor body and which is bounded within the semiconductor body by comparatively high ohmic material and is provided with a contact or connection wire.

Injection lasers in which the laser beam can be moved are disclosed inter alia in U.S. Pat. No. 3,402,366. Said Specification describes structures in which the two sub-contact regions of the divided contact region, viewed in the direction of the laser beam, are situated on an elongation of one another and are separated from each other by a gap which is at least mainly transverse to the laser beam. The sub-contact regions have such a configuration that when the length, measured in the direction of the laser beam, of one sub-contact region decreases in the direction transverse to the laser beam, the length of the other sub-contact region increases.

Experiments have demonstrated that freedom in designing the sub-contact regions is restricted for those cases in which accurate continuous movement of the laser beam is desired. It has been found, however, that satisfactory results can be obtained only when the gap width in a direction transverse to the laser beam is sufficiently non-linear.

Because the gap between the sub-contact regions which is situated above the optical path of the laser beam locally reduces the amplification in the active zone it is also of importance for good operation of the laser that the width of the gap should be kept as small as possible.

These requirements, which are imposed upon the shape of the sub-contact regions, make the practical manufacture of the laser rather complicated.

If it is desired to operate the laser in the c.w. (continuous wave) mode, it is usually necessary to mount the laser with one of its major surfaces on a heat sink of some metal or other, for example, Cu, which is a good heat conductor. Because for this purpose the major surface used is preferably the one which is situated nearest to the p-n junction and in many cases this is the same major surface which comprises the divided contact region, the provision of the heat sink which may at most make an electrical contact with only one of the two sub-contacts is very complicated in this known laser.

SUMMARY OF THE INVENTION

One of the objects of the invention is to provide an injection laser of the above-mentioned kind which can be manufactured in a simple manner. A further particular object of the invention is to provide a laser which can easily be mounted on a heat sink.

The invention is based inter alia on the recognition of the fact that an active zone can be formed near the p-n junction by defining in the semiconductor body two different current paths which overlap each other at least at the area of the p-n junction and by adjusting the electric currents via said current paths in such manner that the total current reaches or exceeds the value of the threshold current only at the area where the current paths overlap each other. The invention is further based on the recognition of the fact that, by making said currents larger and/or smaller with respect to each other, the active zone can be moved backwards or forwards between the various current paths.

An injection laser according to the invention is characterized in that the two sub-contact regions are separated from each other by a gap which extends mainly in the same direction as the laser beam and, viewed on the major surface, it situated above the contact region on the other major surface, the intermediate region of the semiconductor body situated between the sub-contact regions having such a high resistance that different current paths are defined in the semiconductor body which converge in the direction from the two sub-contact regions to the said other contact region and overlap each other at least partly at the area of the p-n junction, so that at that area an active zone can be formed which can be moved in a direction transverse to the laser beam by controlling the current distribution across the sub-contact regions. The two sub-contact regions may simply be formed by mainly straight strips; therefore, special requirements as regards shape which impede the manufacture of the device are not imposed.

Moreover, the width of the gap between the sub-contact regions is not or at least substantially not critical. As a result of this, an injection laser in accordance with the invention can be manufactured in a comparatively simple manner. In addition, as will become apparent from the description of the Figures, the contact region divided into two sub-contact regions may be accommodated on that major surface which is situated opposite in the major surface with which the semiconductor laser is mounted on the heat sink, which is also an important advantage.

A preferred embodiment which has a particularly simple structure is characterized in that the two sub-contact regions are formed by two substantially straight strips extending substantially parallel to each other and separated by a substantially straight strip-shaped gap. A further preferred embodiment is characterized in that the said two sub-contact regions are separated from each other by a strip-shaped gap the center line of which is transverse to the said side surfaces. This is to be understood to mean not only those directions which enclose an angle of 90° with the side surfaces with a tolerance of a few degrees, but also those directions which may differ, for example, by approximately 10° from a right angle to obtain a narrow active zone as described, in Netherlands Patent Application No. 7,607,299.

In an important class of injection lasers the semiconductor body comprises a substrate which adjoins one major surface and a surface region which adjoins the opposite major surface and which is grown epitaxially on the side of the substrate situated opposite to the one major surface and which comprises a number of sub-layers which, in addition to the said p-n junction, form one or more heterojunctions. As is known, due to the limiting action of said heterojunctions they have the advantage that losses within the semiconductor body are restricted. A preferred embodiment is characterized in that the contact region which is provided on the substrate forms the said contact region which is divided into two sub-contact regions. The width of the gap between the sub-contact regions is not critical at all. In a simple embodiment the sub-contact regions may be formed, for example, by two metal strips which are provided on the edges of the semiconductor body at a mutual distance which is sufficiently large to obtain different current paths in the semiconductor body. The width of the gap is associated with the resistivity and the thickness of the substrate. In practical embodiments in which the width of the gap may be 300 to 400 μm, favorable results are obtained, when, for example, when using an n-type GaAs substrate, the doping concentration of the substrate is between $10^{14}$ and $10^{16}$ atoms per $cm^3$ with a thickness between 150 and 300 μm (corresponding to a resistivity between 0.1 and 10 ohm cm).

A preferred embodiment of an injection laser having heterojunctions is characterized in that a first epitaxial sub-layer of the same conductivity type as the substrate is provided on the substrate but has a different composition and forms one of the said heterojunctions and has a resistivity which is at least approximately equally large as the resistivity of the substrate, and in which a second epitaxial sub-layer of the second conductivity type is provided on the first epitaxial sub-layer. A further preferred embodiment in which a good definition of the two current paths can be obtained in a simple manner is characterized in that there is provided between the substrate and the first epitaxial sub-layer of the first conductivity type a buried layer of the second conductivity type which, viewed on the major surfaces, is situated between the two sub-contact regions and which, in a direction transverse to the laser beam, extends only over a part of the width of the semiconductor body.

Another embodiment of an injection laser according to the invention which inter alia has the advantage that a conventional substrate of the usual thickness and doping concentration may be used, is characterized in that the epitaxial surface region comprises the contact region divided into two sub-contact regions and that the semiconductor body is mounted on the same side on a heat sink which is electrically insulated from at least one of the sub-contact regions. As will become apparent from the description of the Figures, due to the fact that the sub-contact regions are situated beside each other instead of behind each other, the laser can nevertheless be mounted in a comparatively simple manner on a heat sink on that side on which the divided contact region is present.

BRIEF DESCRIPTION OF THE DRAWING

The invention will be described in greater detail with reference to various embodiments and the accompanying diagrammatic drawing, in which.

DETAILED DESCRIPTION

Figure 1:
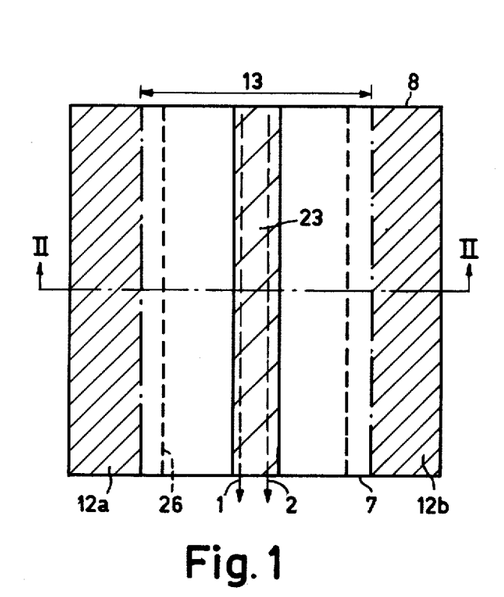
FIG. 1 is a plan view of an injection laser in accordance with the invention.
Figure 2:
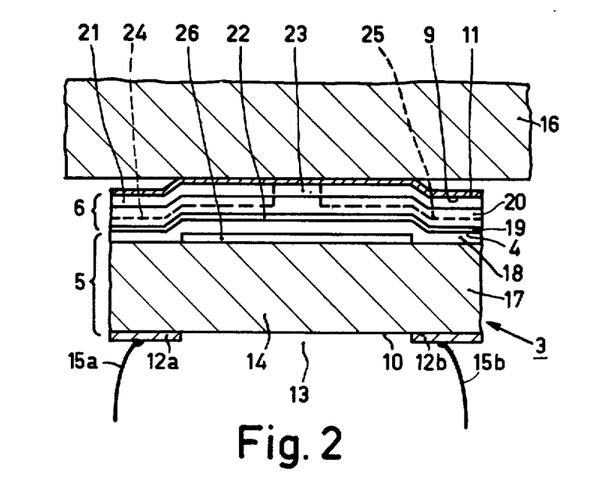
FIG. 2 is a cross-sectional view of said injection laser taken on the line II—II of FIG. 1.

FIGS. 1 and 2 are a plan view and a cross-sectional view, respectively, of an injection laser in accordance with the invention in which the laser beam can be moved in a plane substantially parallel to the injecting p-n junction, shown diagrammatically in FIG. 1 by the paths of rays 1 and 2.

The laser comprises a semiconductor body 3 of a suitable semiconductor material having direct band-to-band junctions, for example GaAs. The p-n junction 4 by means of which an active region can be obtained by injection of charge carriers is formed between the n-type region 5 and the p-type region 6. Two oppositely located and at least partly reflective side surfaces 7, 8 are transverse to the p-n junction 4 and can be obtained in a known manner by cleavage of the semiconductor body along one of its crystal planes. The semiconductor body 3 further comprises two oppositely located major surfaces 9, 10 mainly parallel to the p-n junction 4 which are provided with contact regions for passing an electric current across the p-n junction 4. These contact regions comprise inter alia the metal contact strips 11 and 12. The contact region on the major surface 10 is divided into two mutually separated sub-contact regions, referenced in the drawing as 12a and 12b. By means of this divided contact region the current distribution across the p-n junction 4 can be controlled and hence the location of the laser beam can be moved.

In accordance with the invention, the contact regions 12a and 12b, viewed in the direction of the laser beam, are not situated behind each other but beside each other and are separated from each other by a gap 13 which extends mainly in the same direction as the laser beam and which, viewed in a direction perpendicular to the major surfaces 9, 10, extends above the contact region 11 on the other major surface 9. The intermediate region of the semiconductor body 3 situated between the sub-contacts 12a and 12b has such a high resistance that different current paths are defined in the semiconductor body 3, which paths converge in the direction from the sub-contact regions 12a, 12b to the contact region 11 and may overlap each other partly at the level of the p-n junction 4. As will be explained in detail hereinafter, an active zone within which laser action will occur may be formed at the area where said current paths overlap each other, said zones being movable in a direction transverse to the laser beam between the contact regions 12a and 12b by controlling the current distribution across the sub-contact regions 12a and 12b.

As compared with the configuration in known injection lasers of the present type, the electrode configuration of the contact region 12 is simple and not critical. As a result of this the laser itself can be manufactured in a simple manner, while the laser beam, as experiments have demonstrated, can be adjusted accurately. In addition, as shown in FIG. 2, the laser may be mounted on a heat sink 16 (not shown in FIG. 1 for clarity) on that side opposite to the divided contact region 12.

As shown in the plan view of FIG. 1, the contact regions 12a, b in a very simple embodiment comprise two substantially straight strips which extend substantially parallel to each other and are separated by a likewise substantially straight strip-shaped gap 13 the center line of which is substantially perpendicular to the reflective side surfaces 7, 8.

The strips 12a and 12b are further provided with separate conductors 15a and 15b, respectively, to supply the electric currents.

The electrode configuration of the contact region 12 described may advantageously be used in any type of injection laser. The present embodiment relates to a laser having a double heterojunction. For that purpose the semiconductor body comprises a GaAs substrate 17 which adjoins the major surface 10 and forms part of the n-type region 5. On the surface situated opposite to the surface 10 of the substrate there is provided an epitaxial surface region which adjoins the other major surface 9 and has the following sub-layers: an n-type layer 18 of $Al_xGa_{1-x}As$ (where x is approximately 0.30) which, together with the substrate 17, forms the n-type region 5; the p-type GaAs layer 19 which forms the p-n junction 4 with the n-type AlGaAs layer 18; the p-type $Al_xGa_{1-x}As$ layer 20 (where x is again approximately 0.30); the p-type GaAs layer 21 on which the contact layer 11 is provided. The $Al_xGa_{1-x}As$ layers 18 and 20 together with the intermediate GaAs layer 19 in which the active zone 22 is also situated form two heterojunctions. As is known, said heterojunctions restrict the charge carriers to substantially the active zone and in addition, as a result of the differences in the indices of refraction, keep the radiation losses within the semiconductor body and hence also the threshold value of the current across the p-n junction 4 comparatively low.

As shown in FIG. 2, the contact region on the major surface 9 is provided in the form of a strip the width of which (in a direction transverse to the laser beam 1 or 2) is small as compared with the width of the semiconductor body 3. As is known, the number of transversal modes which might occur during operation can be restricted by means of such a narrow contact region, so that the laser operates mainly only in a fundamental transversal mode. Several possibilities may be used to obtain a narrow contact region. For example, there may be deposited on the GaAs layer 21 an insulating layer of, for example, silicon oxide, in which a narrow strip-shaped window is provided at the area of the contact region, after which the metal layer 11 is provided which at the area of the window forms a narrow contact strip with the semiconductor material. According to an alternative method, a narrow strip-shaped metal layer may be provided at the area of the contact on the surface 9, after which the part of the surface 9 not covered by said metal layer is not subjected to an etching treatment so that recesses are formed beside the metal strip which extend into the p-type $Al_xGa_{1-x}As$ layer 20. In the embodiment described a narrow contact region is obtained by locally subjecting the surface 9 to a proton bombardment so that on either side of the contact region two zones 24, 25 are formed which are converted into electrically insulating material shown in broken lines in FIG. 2 and which bound above the active zone a narrow contact strip 23 of the semiconductor body. Since the distance between the p-n junction 4 and the strip is smaller than the distance between the p-n junction 4 and the major surface 10 of the substrate 17, the width of the active zone is mainly determined by a width of the contact region 11, 23. Only the strip 23 of this contact region is shown in FIG. 1. For clarity the metal layer 11 is not shown in this Figure.

In the present embodiment the divided contact region thus is situated on the substrate side and comprises the two metal strips 12a and 12b situated at the edge of the semiconductor body 3, while the contact region 11, 23 is situated substantially symmetrically between the strips 12a, 12b.

In order to obtain two different readily defined current paths in the semiconductor body it is of importance for the substrate 17 not to serve as a shortcircuit between the contacts 12a and 12b as would be the case when a substrate of conventional dimensions is used which has a conventional resistivity of the order of magnitude of $10^{-3}$ ohm cm. A sufficiently high resistance between the contacts 12a, 12b can be obtained in several manners, for example, by using a substrate 17 having a lower doping concentration (between $10^{16}$ and $10^{14}$ atoms per $cm^3$) than is usual. In a specific embodiment in which the width of the substrate 17 was approximately 500 μm and the thickness approximately 90 μm, satisfactory results were obtained with a doping concentration of approximately $4 \times 10^{15}$ atoms per $cm^3$ corresponding to a resistivity of approximately 0.2 ohm cm.

In order to prevent the resistance between the contacts 12a and 12b from being reduced adversely by the n-type AlGaAs layer 18, the doping concentration of said layer is chosen to be such that the resistivity of said layer is at least approximately equally large as the resistivity of the substrate 17. With usual thickness of the layer 18 and the substrate 17 and a doping concentration of the substrate in the order of $5 \times 10^{15}$, for that purpose a doping concentration of the layer 18 of at most $5 \times 10^{16}$ atoms per $cm^3$ is preferably chosen. In the particular embodiment in which a substrate was used having a thickness of approximately 90 μm and a doping concentration of approximately $4 \times 10^{15}$ atoms per $cm^3$, the doping concentration of the AlGaAs layer 18 was approximately $10^{16}$ Sn atoms per $cm^3$ and the thickness was approximately 2 μm.

The epitaxial layers 19 to 21 may be of the usual composition and thickness: the p-type GaAs layer 19 has a thickness of approximately 0.3 μm and a doping concentration of approximately $5 \times 10^{17}$ Ge atoms per cm$^3$; the p-type Al$_x$Ga$_{1-x}$As layer 20 (x approximately 0.30) has a thickness of approximately 2 μm and a doping concentration of $5 \times 10^{17}$ Ge atoms per cm$^3$; the p-type GaAs layer 21 has a thickness of approximately 1.5 μm and a doping concentration of approximately $2 \times 10^{18}$ Ge atoms per cm$^3$.

As shown in FIG. 2, a p-type buried layer 26 shown in FIG. 1 by broken lines is provided between the Al$_x$Ga$_{1-x}$As layer 18 and the substrate 17. Viewed on the major surfaces 9 and 10, said buried layer 26 is situated between the sub-contact regions 12a, 12b and extends transverse to the laser beam only over a part of the width of the semiconductor body. The electric currents which are passed via the contact 12a and 12b, respectively, to the contact region 11, 23 can substantially not flow via said buried p-type layer but are passed to the regions 22, 23 past said layer 26 on the left-hand and right-hand edges, respectively, of the semiconductor body.

The layer 26 can be obtained by locally providing a p-type surface zone in the n-type substrate 17. In the present embodiment the layer 26 is obtained in a simple manner by locally depositing, preferably epitaxially, p-type semiconductor material on the substrate 17 prior to providing the epitaxial sub-layers 18-21. The width of the buried layer 26 is approximately 400 μm so that with an overall width of the semiconductor body 3 of approximately 500 μm, dimensions of approximately 50 μm remain on either side of the layer 26 to pass the current.

The laser described can be manufactured entirely in the usual manner. A specific embodiment of such a laser exhibited a threshold current of approximately 180 mA with a laser length of approximately 300 μm and a width of approximately 10 μm for the region 23.

Figure 3:
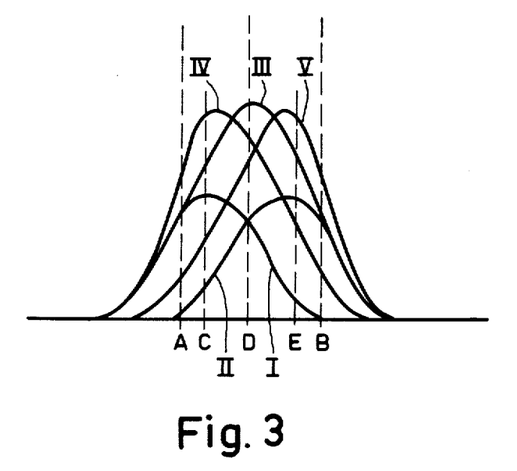
FIG. 3 shows diagrammatically the current distribution at the p-n junction of the injection laser shown in FIGS. 1 and 2 during operation.

FIG. 3 shows diagrammatically the current distribution across the p-n junction 4 so as to clarify the operation of the laser in accordance with the invention. The boundary of the active zone is denoted by the broken lines A and B. Electric currents which are supplied via the contacts 12a and 12b, respectively, will result in current distributions which are represented by the curves I and II (it being assumed that said currents are equally large and that the construction of the laser is substantially symmetrical). The overall current across the p-n junction is represented by the curve III the maximum of which lies in point D, approximately in the center of the active zone. Thus by choosing the correct value of the current supplied to the contacts 12a and 12b, a laser spot can be obtained in this manner the spatial orientation of which corresponds to point D in FIG. 3. In the case where the overall current is supplied to contact 12a so that the current will flow along the left-hand edge of the substrate 14 to the p-n junction 4, a current distribution across the p-n junction is obtained as represented by the curve IV in FIG. 3. The maximum of the current distribution has been shifted to the left with respect to III so that a laser spot is obtained in point C. If on the contrary the overall current is supplied via contact 12b, current distribution V across the p-n junction 4 is obtained and hence a laser spot corresponding to point E is generated. By controlling the electric current distribution across the contacts 12a and 12b, the laser spot can be continuously moved between the points C and E. In the above-mentioned specific embodiment it has proved possible to move the laser spot in this manner over a distance of substantially 2 μm, which is sufficient for a number of important applications, for example, for scanning optical long-playing records to generate error signals for deviations in the tracks of the record, as described, for example, in Netherlands Patent Application No. 76.08.561. Moreover, the device can be manufactured in a simple manner and while avoiding extra critical steps.

In this embodiment the divided sub-contact is provided on the substrate 14. As a result of this the laser can be mounted in known manner at its major surface 9 on the heat sink 16. Said heat sink may consist simply of a conductive material, for example Cu, which is also in electrical contact with the metal layer 11.

Figure 4:
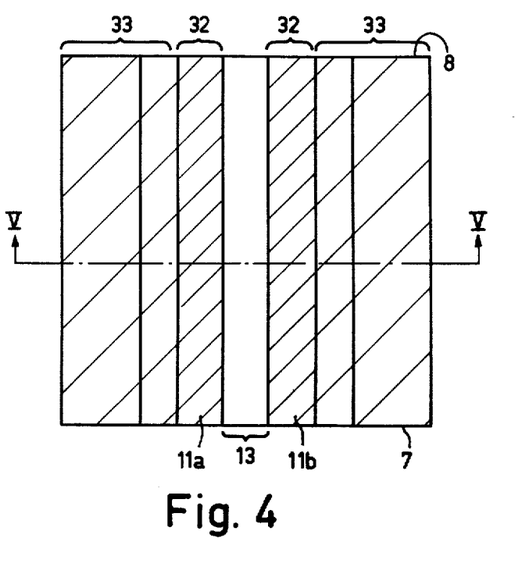
FIG. 4 is a plan view of a second embodiment of an injection laser in accordance with the invention.
Figure 5:
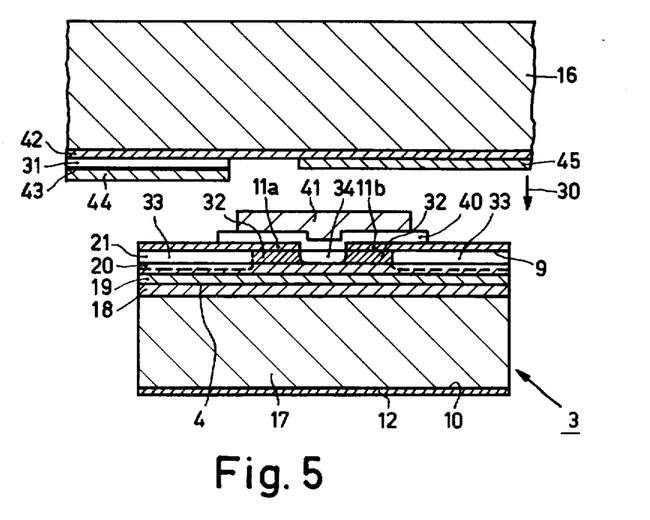
FIG. 5 is a cross-sectional view of said laser taken on the line V—V of FIG. 4, FIGS. 6 to 10 show several stages in the manufacture of said laser.

An embodiment will now be described in which the epitaxial surface region is provided with the divided contact region. FIGS. 4 and 5 are a diagrammatic plan view and a cross-sectional view, respectively, of this embodiment in which for corresponding components the same reference numerals are simply used as in the preceding embodiment. In this case the contact region on the substrate side 10 is denoted by reference numeral 12, and the contact region on the side of the oppositely located surface 9 has metal strips 11a and 11b. With its side having the divided contact 11a, 11b up, the semiconductor body is mounted on the heat sink 16, which in FIG. 5 is shown for clarity at some distance from the body 3 but during assembly may be provided as such in contact with the upper surface of the device, which is shown diagrammatically in FIG. 5 by the arrow 30.

In order to prevent a shortcircuit between the contacts 11a and 11b, at least one of these contacts, namely the contact 11a, is insulated electrically from the heat sink 16 by an insulating layer 31 which covers approximately the left-hand half of the heat sink 16 which may again be of Cu. It is to be noted that the provision of the device on the heat sink will require slightly more complicated process steps than in the preceding embodiment in connection with the required mutual insulation between the contacts 11a and 11b. On the other hand the embodiment described has the advantage that, since the substrate 14 need be provided only with a single contact and the resistance of the substrate 14 plays no or substantially no part, a substrate 14 of the usual composition and the associated comparatively low resistivity may be used. In addition, the buried layer 26 which was used in the first embodiment to obtain separate current paths, is superfluous in the present case.

Since the p-n junction 4 is situated at a distance of only a few μm from the contacts 11a and 11b, the contacts 11a and 11b, in contrast with the contacts 12a, 12b in the preceding embodiment, are situated close together and separated by a narrow gap 13 the width of which is very small as compared with the width of the semiconductor body 3. A specific value for this width is, for example, 5 μm with a width of the semiconductor body of approximately 300 to 500 μm. In this manner again two different current paths overlapping each other at the area of the p-n junction 4 can be obtained.

The sub-contact regions 11a and 11b each comprise a strip of conductive material deposited on the surface 9 and consisting, for example, of a double layer of Cr-Au which is contacted with a comparatively narrow surface strip 32 of the epitaxial region 19-21. In order to be able to connect the contacts 11a and 11b in a simple manner to supply conductors to supply the electric currents, the contacts 11a, 11b each extend from the regions 32 further towards the edge of the semiconductor body 3. Except at the area of the regions 32 the contacts 11a, 11b are further insulated from the semiconductor body 3, for example, by means of an insulating layer of, for example, silicon oxide which is deposited on the surface 9 and in which windows are provided at the area of the surface regions 32, via which windows the contacts 11a and 11b are contacted with the regions 32. In the embodiment described the surface regions 32 are bounded by insulating parts 33 of the semiconductor body 3 which have been obtained by locally bombarding the semiconductor body 3 with protons. In order to prevent shortcircuit between the contacts 11a and 11b the semiconductor material of the semiconductor body 3 is subjected, at the area of the gap 13 between the sub-contacts 11a and 11b, to a treatment to increase the resistance between the contacts 11a and 11b. The increase in resistance between the contacts 11a and 11b can be produced in several manners. For example, the semiconductor body may be subjected locally to a material-removing treatment so that locally a groove is formed between the contacts 11a, 11b which groove extends over a part of the thickness of the p-layers 20, 21. In the present embodiment the semiconductor body 3 is subjected to a proton bombardment at the area of the gap 13 so that a zone 34 of substantially insulating material is formed. The zone 34 extends substantially over the thickness of the p-type GaAs layer 21 and is remote from the p-n junction 4 over such a distance that the active zone is not adversely influenced by the proton bombardment.

The device can be operated in substantially the same manner as the laser described in the preceding embodiment. Via the contacts 11a and 11b electric currents of such a value can be passed across the p-n junction 4 that at the area where the current paths overlap each other the threshold value is exceeded and the laser starts to operate. By making the current via the contact 11a to be larger or smaller than the current which is supplied via the contact 11b, a laser beam may be moved to the left and to the right, respectively, (below the region 34). In this manner the position of the laser beam can be adjusted very accurately over a distance of a few $\mu$m, while in addition the manufacture of the laser is comparatively simple, as will be described in greater detail hereinafter with reference to FIGS. 6 to 10.

The starting material is a semiconductor body 3 which in the FIGS. 6 to 10 is simply shown without details (for example, epitaxial layers). The semiconductor body 3 may be entirely of a composition which is usual for injection lasers, having a substrate 17 of n-type GaAs in a thickness of approximately 100 $\mu$m and a doping concentration of approximately $10^{18}$ atoms/cm$^3$. The n-type Al$_x$Ga$_{1-x}$As (x is approximately 0.30) on the substrate 17 may have a thickness of approximately 3 $\mu$m and a doping concentration of approximately $5 \times 10^{17}$ At/cm$^3$. The p-type layers 19 to 21 may be of the same doping concentrations and thicknesses as the layers 19 to 21 in the preceding embodiment. It is to be noted that by using a substrate which is more highly doped as compared with the preceding embodiment, the resistance between the contacts 11 and 12 and hence the dissipation in the semiconductor body may be lower than in the preceding embodiment.

Figure 6:
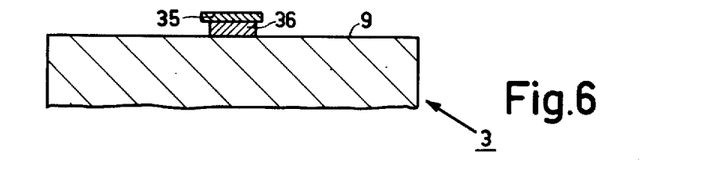

A mask 35, 36 is provided on the surface 9 at the area of the gap between the contacts 11a, 11b which are provided in a later stage of the production. The layer 35 is, for example, of Au, the layer 36 of Ti. The mask 35, 36 can be obtained in a usual manner by first providing an approximately 0.1 $\mu$m thick Ti layer on the surface 9, depositing on the Ti layer an approximately 0.5 $\mu$m thick Au layer and then forming from said layer the mask 35, 36 by etching, the layer 36 being slightly undercut to below the layer 35. The width of the mask 35, 36 is approximately 5 $\mu$m.

Figure 7:
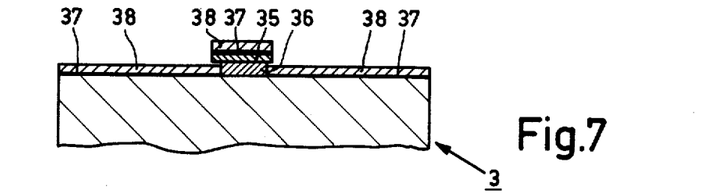
Figure 8:
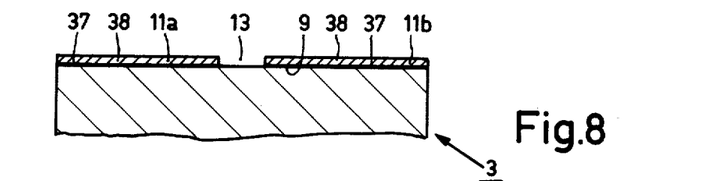

By means of, for example, sputtering, first a thin layer 37 of Cr and thereon an approximately 0.5 $\mu$m thick layer 38 of Pt may then be provided (FIG. 7). The layer 37 of Cr which is shown by a solid line in FIG. 7 only serves to obtain a good adhesion of the contacts 11a, 11b to the GaAs. The mask 35, 36 is then removed, the part of the Cr-Pt layer 37, 38 above the Au layer 35 being also removed simultaneously by means of the known lift-off process. The structure shown in FIG. 8 is then obtained, in which two sub-contacts 11a and 11b have been formed on the surface 9 which consists of the layers 37, 38 and which are separated from each other by the 5 $\mu$m wide gap 13.

The insulating zone 34 is then formed (FIG. 9) by means of a proton bombardment, using the contacts 11a and 11b as a mask.

Figure 9:
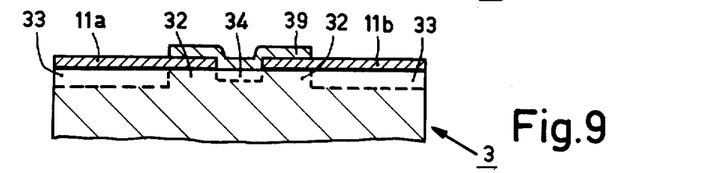
Figure 10:
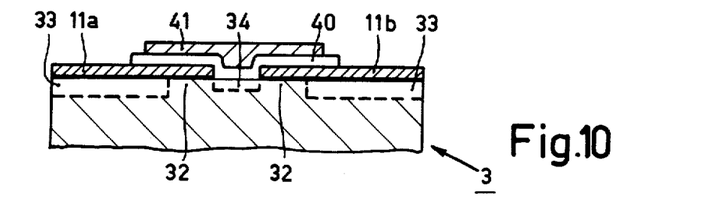

The zone 34 is provided down to a depth at which the distance between the zone 34 and the active zone is approximately 1 $\mu$m, which corresponds approximately to a distance of 1.3 $\mu$m to the p-n junction 4. A masking layer 39 of, for example, Au is then provided to subsequently form the insulating zones 33 by means of a proton bombardment so that the contact regions 32 in the semiconductor body 3 between the insulating zones 33 and 34 are defined. The mask 39 is then removed again, after which (FIG. 10) a comparatively thin electrically insulating layer 40 is provided on the surface 9 above the insulating region 34 and the contacts 11a and 11b above the contact regions 32. As will become apparent hereinafter, the layer 40 serves to electrically insulate the contact 11a from the heat sink 16 and may comprise a layer of Al$_2$O$_3$ in a thickness of approximately 1 $\mu$m. A layer 41 containing, for example, a double layer of Ti and Au may then be provided on the layer 40 with which layer 41 the device may be mounted on the heat sink 16 in a later stage. In this manner the semiconductor structure as shown in FIG. 5 may be obtained.

For the heat sink 16 (FIG. 5) a block of Cu may be used which on its side on which the semiconductor body 3 is mounted has a double layer 42 of Ti and Pt. Said layer serves as a buffer layer between the Cu and an In layer to be provided afterwards. An insulating layer of, for example, Al$_2$O$_3$ which electrically insulates the contacts 11a from the heat sink is provided on the left-hand half of the layer 42, on the side of the contact 11a. A double layer 43 of Ti and Pt is then provided again preferably on the Al$_2$O$_3$. Said layer is shown in FIG. 5 only by a solid line and only on the Al$_2$O$_3$ layer 31, but it will be obvious that said layer may extend over the whole surface of the heat sink 16 provided the part which is deposited on the Al$_2$O$_3$ does not make electrical contact with the remaining parts of said layer.

The layers 44 and 45 of In are then provided after which the semiconductor body 3 may be mounted on the heat sink 16, the contacts 11a and 11b making electrical contact with the layers 44 and 45, respectively, via which the current can be supplied. Inspite of a the very narrow gap 13 (a few $\mu$m) between the contacts 11a and 11b, the tolerance which is to be observed is only a few tens of μm due to the presence of the insulating layer 40 provided above the gap 13 and the adjoining parts of the contacts 11a and 11b so that electrical contacts can be made only to the remaining parts of said contacts on the left-hand and right-hand edges, respectively, of the device.

Figure 12:
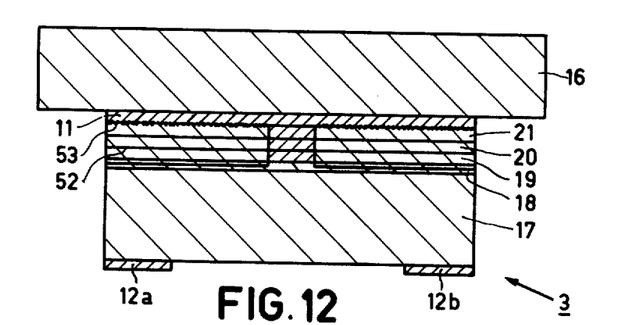
FIG. 12 shows a further embodiment of an injection laser in accordance with the invention.

FIG. 12 shows a further embodiment of an injection laser in accordance with the invention in which the substrate contact is divided into two sub-contacts 12a and 12b. This embodiment differs from the embodiments already described, in particular in that a p-type substrate 17 having a p-type $Al_xGa_{1-x}As$ layer 18, an n-type GaAs layer 19, an n-type $Al_xGa_{1-x}As$ layer 20 and an n-type GaAs layer 21 is used instead of an n-type substrate 17. The use of a p-type substrate 17 has the important advantage that the resistance of the substrate can be maintained at a desired value in a simple and reproducible manner. In fact it has been found in practice that, when an n-type substrate of the desired resistivity is used, the resistivity during the successive process steps does not remain constant, but decreases, apparently because the net concentration of n-type impurities increases, which may have a rather large effect with the comparatively low doping concentration used. Since the mobility of holes is much smaller than that of electrons, the resistivity of p-type material will be much higher than that of n-type material, with doping concentrations remaining the same. Therefore, in order to obtain a substrate having the desired resistivity, the doping concentration in p-type material may be chosen to be much higher than in n-type material. As a result of this, a net dopant concentration variation in p-type material will have a much smaller consequence than in n-type material.

A strip-shaped region is defined in the layers 18 to 21 by means of the p-type regions 52 which can be formed in the epitaxial layers 18 to 21 by means of diffusion of a suitable impurity, for example Z. The upper side 53 of the diffused zones may have been made high-ohmic by means of proton bombardment, so that a shortcircuit between the contact 11 and the substrate 17 is prevented in the case of a deep diffusion. Such a proton bombardment is, of course, not necessary in the case where the p-type zones 52 extend in the semiconductor body down to a depth which is smaller than the thickness of the n-type epitaxial layers 19 to 21.

Figure 13:
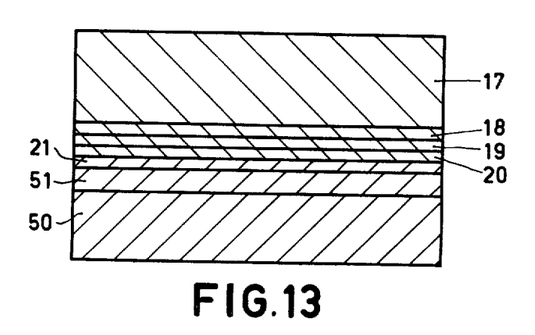
FIG. 13 shows a stage in the manufacture of the laser shown in FIG. 12.

FIG. 13 shows diagrammatically a way of manufacturing the semiconductor body used in the injection laser shown in FIG. 12. The starting material is a body 50 of n-type GaAs. The thickness and doping concentration thereof are not critical. On this body there is first deposited an n-type layer 51 of $Al_xGa_{1-x}As$, the thickness and the doping concentration of which are not critical. On this layer are deposited successively the n-type layers 21, 20 and 19 and the p-type layer 18. The p-type substrate 17 is then provided on the layer 18, also by epitaxial growth. The concentration of the substrate 17 is chosen, for example, in the order of 1 to $2 \times 10^{17}$ atoms/cm³ with a thickness of 80 to 100 μm. The starting body 50 may then be removed in known manner by means of a selective etchant which etches away GaAs much faster than the $Al_xGa_{1-x}As$ material of the layer 51, so that the etching treatment terminates on the layer 51. The layer 51 may then be removed, also selectively by means of a selective etching treatment which terminates on the GaAs layer 21. In this manner the semiconductor body 3 is then obtained with a p-type substrate 17 of the desired composition and a good quality.

Figure 11:
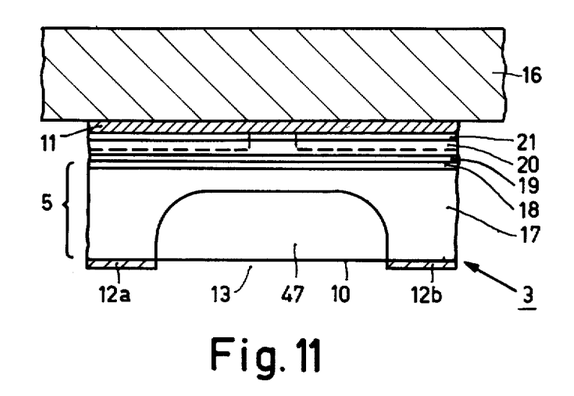
FIG. 11 is a sectional view of a third embodiment of an injection laser in accordance with the invention.

FIG. 11 shows an embodiment which is almost the same as that described with reference to the first embodiment but differs therefrom in that, in order to obtain two readily defined mutually different current paths, the semiconductor body 3 is provided with a groove 47 at the area of the gap 13 between the sub-contacts 12a and 12b instead of (or possibly in combination with) the buried layer 26. The groove 47 extends from the major surface 10 into the substrate 17 over a part of the thickness of the overall n-type region 5, preferably over the whole thickness of the substrate 17.

It will be obvious that the invention is not restricted to the embodiments described but that many variations are possible to those skilled in the art without departing from the scope of this invention.

For example, the starting material in the first and/or third embodiment may be a conventional low-ohmic substrate on which first a thin layer of n-type $Al_xGa_{1-x}As$ is provided by means of epitaxy and then a 70 to 90 μm thick high-ohmic n-type GaAs layer is provided. The low-ohmic substrate may be removed, for example, by means of etching after which, while using the said high-ohmic n-type GaAs layer as a substrate, the device may further be completed to obtain the structure shown in FIG. 2 or FIG. 11.

In the case in which the divided contact region is provided on the upper side of the semiconductor body as described with reference to FIG. 5, a further n-type epitaxial GaAs layer may be deposited on the p-type GaAs layer 21. At the area of the strip-shaped contact regions (11a, 32) and (11b, 32) p-type zones may be formed in said layer extending down to at least the p-type layer 21. On said extra epitaxial layer may be provided the metal tracks 11a, 11b which in this case need not be electrically insulated from the n-type material. Instead of diffused or implanted p-type zones, groves may alternatively be etched in the n-type layer at the area of the contacts, in which the p-type material of the layer 21 can be contacted by the metal strips 11a, 11b.

In further embodiments the radiation does not emanate at the surfaces 7 and 8 but at other surfaces. For example, the substrate 17 may be etched away at the surfaces 7 and 8 so that the epitaxial region projects slightly above the substrate; the surfaces 7 and 8 may be bevelled at the area of the epitaxial region, so that total reflection occurs at said surfaces, the radiation being reflected vertically and being capable of (partly) emanating where the substrate is removed.

Instead of GaAs, other semiconductor materials of, for example, quaternary compounds may alternatively be used.

What is claimed is:

1. An injection laser which comprises:
  a semiconductor body having two semiconductor regions of opposite type conductivities which form an injecting p-n junction in the semiconductor body, the semiconductor body having two oppositely-located side surfaces substantially perpendicular to said p-n junction which form an optical resonator therebetween and two oppositely-located major surfaces substantially parallel to said p-n junction;
  a first contact region provided on one of said two major surfaces and a second contact region provided on the other of said major surfaces for passing a current across the p-n junction, one of said contact regions being divided into two sub-contact regions so that the current distribution across the p-n junction can be controlled by controlling the current distribution between said two sub-contact regions; and means for forming an active zone at least partly adjoining said p-n junction which can be moved in a direction transverse to that of the laser beam by controlling the current distribution between said two sub-contact regions in a plane substantially parallel to that of the p-n junction, the two sub-contact regions being separated from each other by a gap which extends substantially in the same direction as the laser beam, said other contact region extending over its major surface across the area of the perpendicular projection of said gap onto the major surface of the other contact region, and the region of the semiconductor body between said sub-contact regions having a sufficiently high resistance such that a plurality of current paths are defined in said body from said two sub-contact regions and converging to said other contact region and which at least partly overlap each other at the area of said p-n junction.

2. An injection laser as claimed in claim 1, characterized in that the two sub-contact regions are formed by two substantially straight strips extending substantially parallel to each other and being separated by a substantially straight strip-shaped gap.

3. An injection laser as claimed in claim 1 or 2, characterized in that said side surfaces between which an optical resonator is defined are reflective and that the said two sub-contact regions are separated from each other by a strip-shaped gap having a center line which is substantially perpendicular to the reflecting side surfaces.

4. An injection laser as claimed in claim 1 or 2, characterized in that the two subcontact regions are provided with separate supply conductors.

5. An injection laser as claimed in claim 1 or 2, characterized in that the semiconductor body comprises a substrate which adjoins one major surface and an epitaxial surface region which adjoins the opposite major surface and is on the side of the substrate opposite to the one major surface and which comprises a number of sub-layers, which, in addition to the said p-n junction, form one or more heterojunctions.

6. An injection laser as claimed in claim 5, characterized in that the contact region of the epitaxial surface region is formed by a strip, the width of which in a direction transverse to the laser beam is small compared with the width of the semiconductor body, and the distance between said contact region and the p-n junction is smaller than the distance between the p-n junction and the opposite major surface on which the substrate contact region is provided.

7. An injection laser as claimed in claim 6, characterized in that the contact region which is provided on the substrate forms the contact region which is divided into two sub-contact regions.

8. An injection laser as claimed in claim 7, characterized in that said strip-shaped contact region, viewed in a direction transverse to the major surfaces, is situated at least substantially symmetrically between the two sub-contact regions of the first contact region.

9. An injection laser as claimed in claim 7, characterized in that there is provided on the substrate a first epitaxial sub-layer of the same conductivity type as the substrate but having a different composition which forms one of said heterojunctions and has a resistivity which is at least approximately as large as the resistivity of the substrate, a second epitaxial sub-layer of the second conductivity type being provided on the first epitaxial sub-layer.

10. An injection laser as claimed in claim 9, characterized in that the resistivity of the substrate is at least 0.1 ohm cm.

11. An injection laser as claimed in claim 10, characterized in that the resistivity of the substrate is between 0.1 and 10 ohm cm.

12. An injection laser as claimed in claim 9, characterized in that there is provided between the substrate and the first epitaxial sublayer of the first conductivity type a buried layer of the second conductivity type, which, viewed on the major surface, is situated between the two sub-contact regions and which, in a direction transverse to the laser beam, extends only over a part of the width of the semiconductor body.

13. An injection laser as claimed in claim 12, characterized in that the buried layer is formed by semiconductor material of the second conductivity type deposited locally on the substrate.

14. An injection laser as claimed in claim 5, characterized in that the epitaxial surface region comprises the contact region divided into two sub-contact regions and that the semiconductor body is mounted on the same side as the two sub-contacts to a heat sink which is insulated electrically from at least one of the sub-contact regions.

15. An injection laser as claimed in claim 14, characterized in that the sub-contact regions are separated by a gap the width of which, viewed in a direction transverse to the laser beam, is small as compared with the width of the semiconductor body.

16. An injection laser as claimed in claim 15, characterized in that the sub-contact regions each comprise a strip of a conductive material, deposited on the surface, each of which strips contacts a comparatively narrow surface strip of the epitaxial surface region, extends from said surface strip to the edge of the semiconductor body and, beyond the area of said surface strip, is insulated electrically from the semiconductor body by an insulating layer.

17. An injection laser as claimed in claim 1, characterized in that the semiconductor material of the semiconductor body is subjected, at the area of the gap between the sub-contact regions, to a treatment to increase the resistance between the sub-contact regions.

18. An injection laser as claimed in claim 17, characterized in that the semiconductor body is subjected to a proton bombardment at the area of the gap between the sub-contact regions.

19. An injection laser as claimed in claim 17, characterized in that the part of the semiconductor body situated between the sub-contact regions is subjected to a material-removing treatment so that between the sub-contact regions a recess is formed which extends from the surface into the semiconductor body over a part of the thickness of the semiconductor body.

20. An injection laser as claimed in claim 7, characterized in that the substrate is of the p-conductivity type and the epitaxial surface region is of the n-type.

* * * * *